United States Patent [19]

Arney et al.

[11] Patent Number: 4,482,624

[45] Date of Patent: Nov. 13, 1984

[54] PHOTOSENSITIVE MATERIAL EMPLOYING ENCAPSULATED RADIATION SENSITIVE COMPOSITION AND PROCESS FOR IMPROVING SENSITIVITY BY SEQUESTERING OXYGEN

[75] Inventors: Jonathan S. Arney; Richard F. Wright; Paul C. Adair; Dennis L. Williams, all of Chillicothe, Ohio

[73] Assignee: The Mead Corporation, Dayton, Ohio

[21] Appl. No.: 466,704

[22] Filed: Feb. 15, 1983

[51] Int. Cl.³ .......................... G03C 1/40; G03C 1/00
[52] U.S. Cl. .................................... 430/138; 430/211
[58] Field of Search ............... 430/138, 211, 235, 374, 430/541

[56] References Cited

U.S. PATENT DOCUMENTS

| | | |
|---|---|---|
| 2,953,454 | 9/1960 | Berman . |
| 3,001,873 | 9/1961 | Foris . |
| 3,072,481 | 1/1963 | Berman et al. . |
| 3,090,687 | 5/1963 | Berman . |
| 3,111,407 | 11/1963 | Lindquist et al. . |
| 3,116,148 | 12/1963 | Miller . |
| 3,202,510 | 8/1965 | Hollmann . |
| 3,219,446 | 11/1965 | Berman . |
| 3,272,629 | 9/1966 | Hills . |
| 3,700,437 | 10/1972 | Phillips . |
| 3,736,139 | 5/1973 | Yamashita et al. . |
| 3,892,569 | 8/1975 | Speers . |
| 4,149,887 | 4/1979 | Levy . |
| 4,399,209 | 8/1983 | Sanders ............... 430/138 |
| 4,416,966 | 11/1983 | Sanders ............... 430/138 |

FOREIGN PATENT DOCUMENTS

| | | |
|---|---|---|
| 44-17733 | 8/1969 | Japan . |
| 49-6212 | 2/1974 | Japan . |
| 52-34488 | 9/1977 | Japan . |
| 53-9519 | 1/1978 | Japan . |
| 53-9520 | 1/1978 | Japan . |
| 124343 | 8/1982 | Japan . |
| 179836 | 11/1982 | Japan . |
| 197538 | 12/1982 | Japan . |
| 1001832 | 8/1965 | United Kingdom . |
| 1058798 | 2/1967 | United Kingdom . |
| 1141475 | 1/1969 | United Kingdom . |
| 1193923 | 6/1970 | United Kingdom . |

OTHER PUBLICATIONS

"What's Ahead", Lloyd F. Varden, Modern Photography, p. 86, 1958.

D. R. Smith, "A Mathematical Model of Photometric Oxygen Consumption in Photopolymer," from *Photographic Science & Engineering*, vol. 12, No. 5, Sep.–Oct. 1968.

Primary Examiner—John E. Kittle
Assistant Examiner—John L. Goodrow
Attorney, Agent, or Firm—Biebel, French & Nauman

[57] ABSTRACT

A process for improving the sensitivity of imaging materials employing an encapsulated radiation sensitive composition including a photoinitiator; wherein the imaging material is subjected to a uniform exposure which does not produce images but sequesters oxygen present in the capsules and converts it to a non-inhibiting form. An imaging material is also disclosed wherein the radiation sensitive composition additionally includes an oxygen sequestering agent.

25 Claims, 2 Drawing Figures

PHOTOSENSITIVE MATERIAL EMPLOYING ENCAPSULATED RADIATION SENSITIVE COMPOSITION AND PROCESS FOR IMPROVING SENSITIVITY BY SEQUESTERING OXYGEN

BACKGROUND OF THE INVENTION

The present invention relates to a photosensitive material and, more particularly, to a photosensitive material in which a radiation sensitive composition is distributed in a plurality of capsules and exposure of the composition controls the release of the internal phase from the capsules and the activation of an image forming agent. More particularly the present invention relates to a process for improving the sensitivity of these materials by performing a non-imaging exposure which sequesters oxygen.

Photosensitive materials of the aforementioned type are the subject of commonly assigned U.S. application Ser. Nos. 320,356 and 320,643 filed Nov. 12, 1981 now U.S. Pat. Nos. 4,399,209 and 4,440,846, respectively. Images are formed by image-wise exposing these materials to actinic radiation and rupturing the capsules. Where the capsules contain a radiation curable composition, such as polyethylenically unsaturated compounds, the capsule contents become more viscous in the exposed areas and remain less viscous in the unexposed areas. Thus, upon appropriately applying pressure to the image-wise exposed sheet, the capsules in the image areas (which correspond to the unexposed and partially exposed areas) rupture and release their contents whereas the capsules in the non-image areas do not. Release of the internal phase image-wise activates an image forming agent associated with the capsules which proceeds with the formation of an image upon transfer, reaction with a developing agent, or otherwise.

Other types of imaging systems based on photosensitive encapsulates are known.

Berman, U.S. Pat. No. 3,219,446 discloses a transfer imaging process in which azo-blue-"B" black dye is encapsulated with a photocross-linkable polymer or a photopolymerizable monomer as a fluid droplet-containing film or fluid droplet-containing microcapsules. In this system, imaging is accomplished by image-wise exposing a layer of the encapsulate to electromagnetic radiation to cross-link the polymer or polymerize the monomer. This is stated to cause the liquid in the exposed capsules to assume a non-liquid, rigid condition. Images are formed by transferring the dye from the still liquid capsules to a receiving sheet by the use of pressure. Experimentation with the Berman system has shown that it has a very low sensitivity (i.e., requires a comparatively intense exposure to form an image) and provides poor image contrast.

Phillips, U.S. Pat. No. 3,700,439 discloses a photocopy process wherein Michler's ketone is encapsulated in a conventional manner and provided as a layer on a support. Michler's ketone itself is not a color former, but patterned irradiation of the ketone in the capsules converts the ketone to a colorless, acid colorable, dye precursor. When this dye precursor is subsequently contacted with an acid developer, such as acid clay, a visible image is obtained. Phillips discloses both a system in which the exposed imaging sheet is calendered face-to-face with an acid coated receiving sheet to form images and a system wherein the acid developer is on the same surface as the capsule coating so that after rupturing the capsules there is development without transfer.

Levy, U.S. Pat. No. 4,149,887, relates to a capsular imaging material having a photoconductive internal phase which is exposed in an RF field. Exposure increases the conductivity of the internal phase and causes the capsule to heat, swell and then rupture in the image areas. The capsules may contain color precursors which form images by reacting with a developing agent.

The present invention is directed to improving the sensitivity of capsulated imaging materials employing radiation sensitive compositions by conducting an oxygen sequestering exposure.

SUMMARY OF THE INVENTION

The present invention provides a process for imaging using a photosensitive material employing an encapsulated radiation sensitive composition which undergoes a viscosity change upon exposure whereby improved photographic properties are provided. In particular, the present invention is directed to improving the sensitivity of the aforementioned material by subjecting it to a non-imaging exposure in the form of a pre-exposure or a co-exposure which reacts the oxygen in the capsules and converts it to a noninhibiting form. Thus, the present invention provides a process for imaging with capsulated imaging materials which comprises uniformly exposing the material to a first radiation which reacts the oxygen in the capsules, image-wise exposing the material to a second radiation which controls the formation of images, and rupturing the capsules such that they image-wise release their contents.

It has been found that the presence of oxygen in the capsules containing the radiation sensitive composition reduces the sensitivity of the composition. Typically, the radiation sensitive compositions used in the aforementioned imaging materials contain a photoinitiator. The photoinitiator generates a radical upon exposure to actinic radiation which initiates well known photochemistry that alters the viscosity of the internal phase and controls its release from the capsules. When oxygen is present in the capsules, the radicals frequently react with the oxygen faster than they react with the monomers or polymers making up the radiation sensitive composition. Thus, the imaging photochemistry is inhibited until the oxygen is depleted. The sensitivity of the material is also less because the total exposure required to form images is equal to the sum of the exposure involved in forming radicals which react with oxygen in the capsules and the exposure involved in forming radicals which participate in the imaging photochemistry.

In accordance with the present invention a pre-exposure of a co-exposure is used to generate radicals which react with the oxygen present in the capsules and thereby prevent it from inhibiting the imaging photochemistry during the imaging exposure. While it is known to pre-expose photoresist-type materials to react oxygen and improve image quality (See Smith et al, Photographic Science and Engineering, Volume 12, No. 5, September–October 1968, pp. 263–66), a unique feature of a capsulated photosensitive system is that the capsule wall inhibits oxygen diffusion. As a result, the amount of oxygen in the capsules can be reduced to lower levels and maintained there longer. By exposing the photosensitive material to reactively deplete or sequester the oxygen and conducting the imaging exposure before substantial amounts of oxygen are replaced by diffusion, several advantages are achieved. First, the sensitivity of the material is improved significantly. In addition, the range of exposure times over which reciprocity behavior is achieved is broadened. It has also been found that gamma is a function of oxygen concentration and can be controlled by controlling the degree of the de-oxygenating exposure (its intensity and time).

The terms "deplete", "sequester" and "de-oxygenate" as used herein refer to the conversion of oxygen present in the capsules to a non-inhibiting form.

In accordance with one embodiment of the invention oxygen is sequestered using an imaging photoinitiator by conducting de-oxygenating exposure at an intensity which is insufficient to form images but is sufficient to sequester the oxygen present in the capsules. In accordance with this embodiment of the invention the same radiation wavelength may be used for the imaging and de-oxygenating exposures. Thus, by exposing a coated sheet of photosensitive microcapsules to radiation which is sufficiently intense to almost but not quite cause the imaging reactions to occur within the capsule, oxygen is consumed by the free radicals generated by the imaging photoinitiator. This exposure effectively reduces the level of inhibiting oxygen in the capsules and the capsules become significantly more sensitive to actinic radiation.

In another embodiment, in addition to the imaging photoinitiator an oxygen sequestering agent may be incorporated in the capsules. The oxygen sequestering agent generates oxygen-consuming radicals like the imaging photoinitiator but is preferentially sensitive to radiation to which the radiation sensitive composition is significantly less sensitive (for example radiation of a different wavelength). In this manner, the intensity of the de-oxygenating exposure is less critical and this exposure can be accomplished without substantially advancing the imaging chemistry. In accordance with one manifestation of the present invention, the oxygen sequestering agent is thermally activated whereas the imaging initiator associated with and the radiation sensitive composition is light sensitive.

It is essential that the imaging exposure be conducted within a time frame in which substantial oxygen cannot re-infiltrate the system such that the advantages of the deoxygenating exposure are not lost. Typically, this time frame must be less than 16 seconds. Thus, the deoxygenating exposure can be conducted as a co-exposure, i.e., at the same time as the imaging exposure or as a pre-exposure which preceeds the imaging exposure, or by a combined pre/co-exposure.

By using capsules having a low degree of oxygen impermeability the time frame within which pre-exposure and imaging exposure must occur can be extended. In the case of microcapsules, this can be accomplished by forming the capsule wall from a material having low oxygen permeability. In the case of an open phase system in which the capsules consist of droplets of radiation sensitive material dispersed in a binder, a low oxygen permeable binder may be selected. A combination of the aforementioned techniques may also be used.

In accordance with another embodiment of the invention advantage can be made of the oxygen sensitivity of the encapsulated system in attaining room light handleability. Oxygen-inhibited radiation sensitive compositions are known. By encapsulating these compositions with an oxygen sequestering agent which is non-room light activatable, for example, a thermally activated initiator, it may be possible to construct a photosensitive material which can be handled in room light and can be thermally activated by heating to sequester the inhibiting oxygen and render the material light sensitive.

Summarizing, the present invention provides a process for imaging a photosensitive material including a support having on a surface thereof a photosensitive layer containing a plurality of capsules containing a radiation sensitive composition which undergoes a change in viscosity upon exposure to actinic radiation within the internal phase, and an image forming agent associated with said capsules such that by rupturing said capsules and releasing said internal phase said image forming agent is activated, which comprises:

uniformly exposing said material to a first radiation of an intensity insufficient to substantially alter said viscosity but of sufficient intensity to convert the oxygen present in said capsules to a non-inhibiting form, image-wise exposing said material to a second radiation of sufficient intensity to substantially alter said viscosity, and image-wise releasing said internal phase from said capsules and thereby activating said image-forming agent and forming an image said first and second radiation can be but are not necessarily of the same wavelength.

The present invention also provides a photosensitive material comprising a support having on a surface thereof a photosensitive layer including a plurality of capsules containing, as the internal phase, a radiation sensitive composition which undergoes a change in viscosity upon exposure to actinic radiation, said radiation sensitive composition including a photoinitiator, and an agent in addition to said photoinitiator which sequesters oxygen upon exposure to radiation of a lesser intensity or of a different wavelength than said actinic radiation; and an image forming agent being associated with said capsules such that by rupturing said capsules and releasing said internal phase said image forming agent is activated.

DETAILED DESCRIPTION OF THE INVENTION

Figure 1:
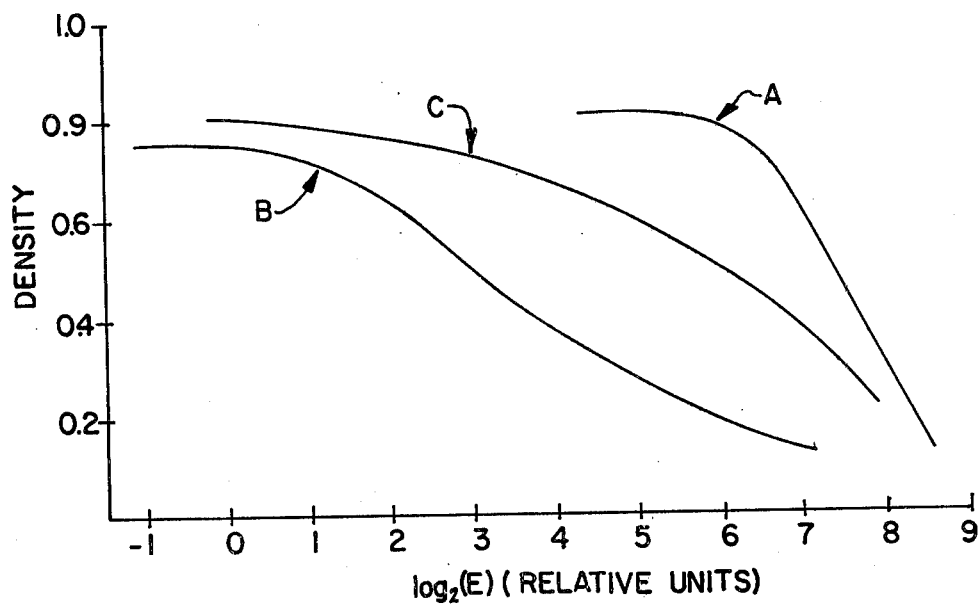
FIG. 1 is a plot of Density versus $\log_2 E$ in relative units for capsulated photosensitive materials (Example 1) exposed in air (Curve A), nitrogen (Curve B) and after a pre-exposure of $10^{-3}$ sec at an intensity just below imaging intensity (Curve C).

FIG. 1 is a plot of Density versus $\log_2 E$ (exposure in relative units) for the imaging material of Example 1 exposed in air (Curve A), nitrogen (Curve B) and after pre-exposure (Curve C). It can be seen in FIG. 1, that the imaging material (B) exposed in nitrogen is substantially more sensitive than the material (A) exposed in air. A curve similar to curve B is obtained when the imaging material is exposed in a vacuum. A pre-exposed material (Curve C) behaves similar to a material exposed in an oxygen free environment. FIG. 1 illustrates that by pre-exposing the material, the sensitivity and film speed of the system are improved at least 2 f/stops.

The deoxygenating exposure performed in accordance with the present invention is performed at an intensity and exposure time which does not substantially advance the imaging chemistry, i.e., there is not a sufficient change in the viscosity of the internal phase to affect capsule rupture, release of the internal phase, or mobilization of the image-forming agent. This degree of exposure can be determined empirically for a given photosensitive material by exposing the material after various de-oxygenating exposures and checking for a loss in image density. The particular time and intensity of the de-oxygenating exposure are not critical provided they are sufficient to reduce the level of inhibiting oxygen in the capsules without imaging. Obviously, if the de-oxygenating exposure is too low to reduce the level of oxygen significantly, there is little advantage. Theoretically, however, any degree of de-oxygenating exposure will react oxygen and provide some benefit if imaging exposure is performed within a time frame short by comparison to the time scale of oxygen diffusion. Studies of the inventors indicate up to 97% of the inhibiting oxygen present in the capsules can be removed in accordance with the present invention.

Figure 2:
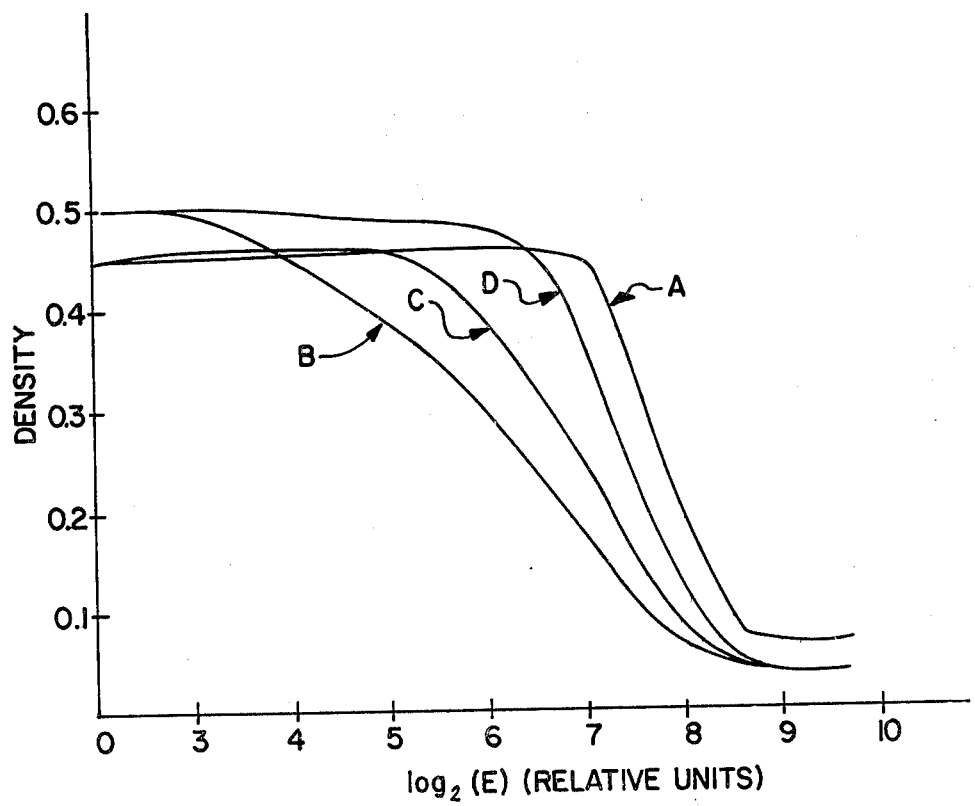
FIG. 2 is a plot of Density versus log E in relative units for a material (Example 2) exposed directly (Curve A), at full deoxygenating exposure (Curve B), ½ full de-oxygenating exposure (Curve C) and ¼ full de-oxygenating exposure (Curve D).

By adjusting the degree of de-oxygenating exposure, the gamma value of the imaging material can be controlled. It has been found that the de-oxygenating exposure shifts the shoulder speed of the photographic material faster than the toe speed resulting in a lower gamma. See for example FIGS. 1 and 2 wherein the lower toe portion of the curves is only slightly shifted by de-oxygenation whereas the upper shoulder portions are shifted substantially. As a result the slope (gamma) of the intermediate portions of the curves decreases with increased deoxygenation. Thus, to obtain a high-speed, low contrast material having low gamma, the maximum de-oxygenating exposure should be used which minimizes the level of inhibiting oxygen. For a less sensitive, high contrast, high gamma material, a lesser degree of de-oxygenating exposure can be used (or the time between pre-exposure and imaging exposure can be increased) which provides a less inhibiting concentration of oxygen in the capsules. In FIG. 2 the imaging material of Example 1 was exposed without a de-oxygenating exposure (Curve A), and after a full (Curve B), ½ full (Curve C) and ¼ full (Curve D) de-oxygenating exposure. Curves B–D illustrate materials processed in accordance with the present invention. Curve B exhibits that imaging materials having minimum oxygen present in the capsules provide faster shoulder speed and the lower gamma whereas imaging materials which have oxygen levels approaching atmospheric concentrations have higher gamma and are less sensitive (Curve A).

Above, the photoinitiator from the radiation sensitive composition is used as the oxygen sequestering agent and the amount of deoxygenating exposure is limited to prevent imaging. This criticality can be avoided or lessened if the photosensitive material employs an oxygen sequestering agent which is distinct from the imaging photoinitiator and which is sensitive to radiation to which the imaging photoinitiator and the radiation sensitive composition are significantly less sensitive. For example, if the capsules contain an ultraviolet sensitive composition but the sequestering agent is thermally activated, it is possible to conduct de-oxygenating exposure over a broad range of intensities without reacting the ultraviolet sensitive composition. This is also true where the sequestering agent and radiation sensitive composition are sensitive to different wavelengths of light.

Numerous examples of suitable imaging initiators can be found in the literature. Depending on the sensitivity of these compounds they can be used alone or in combination as an imaging photoinitiator and/or an oxygen scavenging agent in the present invention. It is possible to use either homolytic photoinitiators which are converted to an active species by radiation and generate a radical by abstracting a hydrogen from a hydrogen donor. There may also be used photoinitiators which complex with the sensitizer to produce a free radical generating species or photoinitiators which otherwise generate radicals in the presence of a sensitizer. If the system relies upon ionic polymerization, the photoinitiator may be the anion or cation generating type, depending on the nature of the polymerization.

Examples of photoinitiators useful as imaging and/or deoxygenating initiators in the present invention include diaryl ketone derivatives, and benzoin alkyl ethers. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes.

In many cases it is advantageous to use a combination of imaging photoinitiators. For ultraviolet sensitivity one desirable combination is a combination of Michler's ketone and benzoin methyl ether (preferred ratio 2:5). Another useful combination is 2,2'-dimethoxy-2-phenylacetophenone, isopropylxanthone and ethyl paradimethylamino-benzoate. The later is preferably used with TMPTA to provide a radiation sensitive composition.

The amount of imaging photoinitiator in the radiation sensitive composition depends on the particular photosensitive material selected. It must be present in an amount sufficient to initiate polymerization or cross-linking within a short exposure time. When the photoinitiator is also relied upon as the oxygen sequestering agent, it must be used in amounts sufficient to fulfill both functions. For example, if benzoin methyl ether is the photoinitiator, it is typically present in an amount equal to approximately 10% of the weight of photosensitive material in the capsules' internal phase. Those skilled in the art can readily determine the amount suitable for the desired exposure properties when other initiators are used.

While not tested, some representative examples of compounds that may be useful as thermally sensitive sequestering agents are aromatic peroxides such as benzoyl peroxide. Another type agent that may be useful in sequestering oxygen upon exposure is a photosensitizer that converts oxygen to singlet oxygen upon irradiation. Rose bengal, erosin, and methylene blue are typical examples. These compounds are used in combination with well known singlet oxygen scavengers such as 1,3-diphenylisobenzofuran, 9,10-diphenylanthracene, tetraphenylcyclopentadienone and others that will be evident to those skilled in this art.

The sequestering agent is employed in an amount sufficient to react the oxygen present in the capsules and is usually used in an amount many times that stoichiometrically required. Typically the amount of the oxygen sequestering agent ranges from about $10^{-3}$ to $10^{-1}$ moles/l.

The imaging materials to which the present invention is directed employ a radiation sensitive composition which undergoes a change in viscosity upon exposure to actinic radiation. "Actinic radiation" includes the entire electromagnetic spectrum (U.V., I.R., Visible), X-ray and ion beam radiation. These materials of the invention may be positive working or negative working depending upon the nature of the radiation sensitive composition in the internal phase. For example, where the radiation sensitive composition contains a photopolymerizable or photocrosslinkable material, in the exposed areas the internal phase solidifies or increases in viscosity and thereby prevents release or reaction of the image forming elements associated with the capsules. In the unexposed areas, the internal phase remains liquid and mobilizes the image-forming agents. In this manner positive images are formed. On the other hand, where the capsules contain a photodepolymerizable material in the internal phase, exposure reduces viscosity and the elements active in the image-forming process are released in the exposed areas whereby negative images are formed.

Typical positive-working radiation sensitive compositions include a photoinitiator and a monomer, dimer, or oligomer which is polymerized to a higher molecular weight compound or a polymer which is cross-linked upon exposure or a compound which is depolymerized or otherwise decomposed upon exposure.

Ethylenically unsaturated organic compounds are useful in radiation sensitive compositions. These compounds contain at least one terminal ethylene group per molecule. Typically, they are liquid and can double as a diluent oil for the internal phase. Ethylenically unsaturated compounds having two or more terminal ethylene groups per molecule are preferred. An example of this preferred subgroup are ethylenically unsaturated acid esters of polyhydric alcohols, such as trimethylol propane triacrylate (TMPTA).

Another suitable radiation sensitive composition is an acrylate prepolymer derived from the partial reaction of pentaerythritol with acrylic acid or acrylic acid esters. Photosensitive compositions based on these prepolymers having an acrylate functionality of between approximately two and three are available commercially in two-package systems from the Richardson Company,, Melrose Park, Ill., such as RL-1482 and RL-1483. These are recommended to be mixed together to form a radiation curable clear varnish in a ratio of 4.4 parts of RL-1482 to one part RL-1483.

Another group of substances useful as radiation sensitive compositions include isocyanate modified acrylic, methacrylic and itaconic acid esters of polyhydric alcohols as disclosed in U.S. Pat. Nos. 3,783,151; 3,759,809 and 3,825,479, all to Carlick et al. Radiation curable compositions including these isocyanate modified esters and reactive diluents such as tetraethylene glycol diacrylate as well as photoinitiators such as chlorinated resins, chlorinated paraffins and amine photoinitiation synergists are commercially available as over print varnishes from Sun Chemical Corp., Carlstat, N.J., under the tradename of Sun Cure resins.

The radiation sensitive component of several radiation curable inks is also suitable for use in this invention. An example of this type of material is a mixture of pentaerythritol acrylate and a halogenated aromatic, aliphatic cyclic or aliphatic photoinitiator, as disclosed in U.S. Pat. No. 3,661,614 to Bessemir et al.

An example of radiation depolymerizable materials that may be useful in other embodiments of the invention are 3-oximino-2-butanone methacrylate which undergoes main chain scission upon U.V. exposure and poly 4'-alkyl acylophenones. See Reichmanis, E.; Am. Chem. Soc. Div. Org. Coat. Plast. Chem. Prepr. 1980. 43, 243–251 and Lukac, I.; Chmela S., Int. Conf. on Modif. Polym. 5th. Bratislave, Czech. July 3–6, 1979, I.U.P.A.C. Oxford, England 1979, 1, 176–182.

The radiation sensitive composition must make up a large enough proportion of the internal phase to effectively control the flow of the image-forming agent on exposure. This generally means that the radiation sensitive material must constitute approximately 40 to 99% by weight of the internal phase of the capsules.

The internal phase may additionally include a diluent oil. Inclusion of the oil will often improve half tone gradation in visual images. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

In forming microcapsules it is important that an encapsulation technique be used which provides high quality capsules which are responsive to changes in the internal phase viscosity in terms of their ability to rupture.

A radiation sensitive composition as described above can be encapsulated in various wall formers using techniques known in the area of carbonless paper including coacervation, interfacial polymerization, polymerication of one or more monomers in an oil, as well as various metling, dispersing and cooling methods. Oil soluble materials have been encapsulated in hydrophilic wall-forming materials such as gelatin-type materials (see U.S. Pat. Nos. 2,730,456 and 2,800,457 to Green et al) including gum arabic, polyvinyl alcohol, carboxymethyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanate-polyol wall-formers (see U.S. Pat. No. 3,796,669 to Kirintani et al); urea formaldehyde wall-formers, particularly urearesorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle). The material used to form the capsule walls must be selected based on the radiation sensitive composition that is to be encapsulated. The capsule forming material must be substantially transparent to the radiation to which it will be exposed. For the systems described above, urea-resorcinol-formaldehyde and gelatin capsules are preferred.

An open phase system may be used instead of an encapsulated one. This can be done by dispersing what would otherwise be the capsule contents throughout the coating on the substrate as discrete droplets. Suitable coatings for this embodiment include polymer binders whose viscosity has been adjusted to match the dispersion required in the coating. Suitable binders are gelatin, polyvinyl alcohol, polyacrylamide, and acrylic lattices. Whenever reference is made to "capsules" and "encapsulation" without reference to a discrete capsule wall in this specification or the appended claims, those terms are intended to include the alternative of an open phase system.

The time scale of oxygen diffusion plays a significant role in the present invention as described above. By controlling it, greater practical advantage of the invention can be realized. Lower oxygen levels and higher sensitivities can be achieved with de-oxygenating exposure.

The time scale of oxygen diffusion can be influenced by the nature and the thickness of the capsule wall. Preferred wall forming materials and open phase systems have low oxygen permeability. In addition, film forming additives can be added to the coating or wall formulation to inhibit oxygen diffusion. Materials having low oxygen permeability useful in the present invention include poly(vinylidene chloride), poly(vinyl alcohol), poly(ethylene teraphthalate), polyamide, poly(vinyl chloride), polyester, nylon, microcrystalline wax and rubber latex.

Oxygen diffusion is also believed to be a function of capsule size with smaller capsules providing a higher surface area to unit volume and a higher diffusion rate. Thus, the diffusion time scale can also be adjusted by controlling capsule size. The capsules used in the invention typically range from about 1 to 25 microns, preferably from about 3 to 15 microns, and more preferably from 3 to 10 microns in size.

The photosensitive materials and imaging processes of the present invention can be used to form a variety of different type images depending upon the nature of the image-forming agents used in conjunction with the capsules. The term "image-forming agent" herein refers to any agent which functions in forming the image, the activation/mobilization of which is controlled through image-wise releasing the internal phase from the capsules. Related and commonly assigned U.S. Pat. Nos. 4,399,209 and 4,440,846, which are incorporated herein by reference, disclose systems for forming images by reacting chromogenic materials (the image-forming agents) such as color precursors and color developers used in the carbonless paper art wherein the reaction of these materials is exposure controlled as described above by associating their activation, mobilization or release with the release of the internal phase. Transfer and self-contained imaging systems are disclosed. In related and commonly assigned U.S. application Ser. No. 339,917 filed Jan. 18, 1982, also incorporated herein by reference, a system for forming polychromatic images is also disclosed.

Typical color precursors useful in the aforesaid embodiments include colorless electron donating type compounds. Representative examples of such color formers include substantially colorless compounds having in their partial skeleton a lactone, a lactam, a sultone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI are often used alone or in combination as color precursors in the present invention.

Illustrative examples of color developers useful in conjunction with the embodiment employing the aforesaid color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert butyl salicylate, oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

In addition to the foregoing embodiments, images can also be formed by various other physical and/or chemical reactions using other types of image-forming agents. For example, affinity for a toner can be impacted to the internal phase such that after image-wise rupturing the capsules and applying toner the toner selectively adheres to the support in the areas of ruptured capsules. The toner does not adhere to the unruptured capsules and in this manner images are formed. In this embodiment, the internal phase itself may be active in imaging without the addition of a distinct image forming agent.

In still another embodiment, images can be formed by encapsulating a chelating agent as the image-forming agent which reacts with a metal salt to generate a color image. Some typical examples of useful image-forming pairs of this type are nickel nitrate and N,N' bis(2-octanoyloxyethyl)dithiooxamide.

In another embodiment of the present invention the capsules contain a visible dye in the internal phase and images are formed by contacting the exposed imaging material under pressure with a plain paper or a paper treated to enhance its affinity for the visible dye. In this manner the dye transfers to the paper from the areas of the ruptured capsules. Substantially any benign colored dye, i.e., a dye does not detrimentally attenuate the exposure radiation can be used in this embodiment. A few examples are Sudan Blue and Rhodamine B dyes.

Furthermore, the image-forming agent may be present in the capsule wall of a discrete capsule or in the binder of an open phase system or in a binder or coating used with discrete capsules or an open phase system. For example, the photosensitive material can be designed such that the image-wise ruptured capsules release a solvent for the image-forming agent or the unpolymerized radiation sensitive composition itself acts as a solvent which dissolves or otherwise renders the agent mobile. Thus, embodiments are envisioned in which a dye or chromogenic material is fixed in a capsule wall or binder and is released by interaction with the internal phase upon rupturing the capsules.

In those embodiments in which the image-forming agent reacts with a developer material the developer material may be present on the same support or a separate support from the photosensitive material. For example, so-called self-contained sheets can be prepared by incorporating the developer material in a separate layer on the support carrying the capsules such that upon image-wise rupturing the capsules, the image forming agent migrates to the developer layer when it reacts to form an image. Otherwise, imaging may be performed by rupturing the capsules in contact with a receiving sheet coated with the developer material whereupon the image-forming agent transfers and reacts with the developer material to produce am image. Where the capsules contain a visible dye as the image forming agent, transfer may be to plain paper or paper coated to enhance its affinity for the dye.

The most common substrate for this invention is paper. The papar may be a commercial impact raw stock, or special grade paper such as cast-coated paper or chrome-rolled paper. The latter two papers are preferred when using capsules having a diameter between approximately 1 and 5 microns, because the surface of these papers is smoother and therefore the capsules are not as easily embedded in the stock fibers. Transparent substrates such as polyethylene terephthalate and translucent substrates can also be used in this invention. Their advantage is that the latent image formed need not be optically reversed for printing.

Imaging sheets embodying the invention imaging system can be exposed using a fairly simple exposure apparatus. In its simplest form for reflection imaging, the apparatus requires only a radiation sources for deoxygenating and imaging exposures, means of focusing the exposure radiation from the original onto the imaging sheet means, means to join the imaging sheet with the developer sheet and means for rupturing the encapsules. Simplified means such as this can be used with the invention because development is essentially a dry process with the developer and chromogenic material reacting in only the infinitesimal droplets of solvent encapsulated in the internal phase. Furthermore, the chromogenic material and the developer are on the imaging and developer sheets in the amounts (coverage) required for imaging, hence, the invention obviates the elaborate means required in most prior photocopy systems for coating and metering the developing agent onto the imaging sheet in sufficient amounts.

The present invention is further illustrated by the following non-limiting examples. Wherein the sensitivity characteristics of the imaging materials are determined by the following procedure.

A sample of the imaging sheet to be tested is exposed to a light source consisting of one 15T8/B1 and one 15T8/D fluorescent tube. Exposure time is controlled with a mechanically operated shutter. Exposure intensity is controlled by placing a VWR 21-step transparent sensitivity guide in face-to-face contact with the imaging sheet being tested. In this way, a series of exposures (intensity x time) are achieved across the face of the imaging sheet. The four second exposure achieved through the least transparent section of the step-wedge is arbitrarily assigned the relative exposure value (E=intensity×time) of unity ($\log_2 E=0$). Exposures through other portions of the step-wedge were expressed relative to this unity exposure. Following exposure through the step-wedge, the imaging sheet is developed by passing the sheet, in face-to-face contact with a Lewis acid type developer sheet, through a set of pressure rollers. The resulting image density on the developer sheet is read with an ordinary reflection densitometer. The image density is plotted against the corresponding relative exposure to generate a characteristic sensitivity curve (an H&D) curve) which represents the sensitivity characteristics of the imaging sheet.

EXAMPLE 1

A mixture of 22.6 g 20.4% Isobam, 54.5 g water and 30.8 g gum arabic was heated with stirring to 60° C. and the pH was adjusted to 4.0 with the addition of 20% sulfuric acid. Thereafter 8.3 g area and 0.8 g resorcinol were added and the solution was maintained at 60° C. to prepare a continuous phase. The continuous phase was placed in a Waring Blender and a photoactive internal phase made up of 50.0 g trimethylolpropane triacrylate (TMPTA), 2.2 g benzophenone, 0.28 g Michler's Ketone and 6.0 g Copikem X (in 50% dibutyl succinate) was added at 60° C. with blending at 90 V for 90 seconds. Thereafter the speed of the blender was reduced to 40 V and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfide was dissolved in the mixture with stirring.

Three imaging sheets (A, B, and C) were prepared by coating the above mixture on 80 pound Black and White Enamel Stock (a product of Mead Corp.) using a No. 12 meyer rod after diluting 1:1 with water containing 1% Triton-X-100 (Rohm and Haas Chemical Co.). Sheet A was exposed and evaluated in air as described previously. Sheet B was exposed and evaluated under the same conditions as Sheet A except that exposure was performed under a nitrogen atmosphere. Sheet C was exposed in the same manner as Sheet A after pre-exposing the sheet for $10^{-3}$ seconds to a Xenon flash lamp. The lag time between the pre-exposure and the image forming exposure through the step-wedge was held at less than ½ seconds. The H&D curves for each of sheets A, B and C are shown in FIG. 1.

EXAMPLE 2

A mixture of 22.6 g 20.4% Isobam, 54.5 g water and 30.8 g gum arabic was heated with stirring to 60° C. and the pH was adjusted to 4.0 with the addition of 20% sulfuric acid. Thereafter 8.3 g urea and 0.8 g resorcinol were added and the solution was maintained at 60° C. to prepare a continuous phase. The continuous phase was placed in a Waring blender and a solution of 50 g TMPTA, 12 g of Irgacure 651, 1 g Quantacure ITX, 1 g Quantacure EPO and 6 g of 50% Copikem X in dibutyl succinate was added at 60° C. with blending at 90 V for 90 seconds as the internal phase. Thereafter the speed of the blender was reduced to 40 V and 21.4 ml of 37% formaldehyde was added. Blending was continued at that speed for 2 hours at 60° C. The emulsion was then transferred to a metal beaker and 0.6 g of ammonium sulfate in 12.2 g water was added. This emulsion was stirred with an overhead mixer at 60° C. for another hour and the pH was adjusted to 9.0 using a 10% solution of sodium hydroxide. Finally, 2.8 g sodium bisulfite was dissolved in the mixture with stirring.

Four imaging sheets (A, B, C, D) were prepared by coating capsule batches prepared as above on 80 pound Black and White Enamel stock (a product of Mead Corporation), using a No. 12 meyer rod after diluting 1:1 with water containing 1% Triton-X 100 (Rohm and Haas Chemical Co.).

Sample A was exposed and evaluated as described previously. Sample B was uniformly pre-exposed using a SUNPAK Auto-611 strobe (a product of SUNPAK Corp.) at a full power setting at a distance of 24 inches from the coated side of the imaging sheet (the closest distance at which no loss in density was observed upon development) followed immediately thereafter by an imaging exposure through the step-wedge in a manner identical to sample A. Samples C and D were exposed in the same manner as sample B except the SUNPAK strobe was set at ½ power and ¼ power, respectively. The samples were developed by passing them in faceto-face contact with a developer sheet through a pair of nip rollers. The developer sheet was prepared as follows: A mixture of 852 g water, 250 g 25% Tamol 731 (Rohm & Haas Chemical Co.), 75 g HT clay, 1000 g KC-11 (a synthetic developer manufactured by Fuji Foto Film Company, Ltd.), 15 g Calgon T (Calgon, Inc.) 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel base stock at 30 to 35% solids to give a coat weight of 8 to 10 g/m². The H & D curves for samples A, B, C and D are shown in FIG. 2. Where it can be seen that pre-exposure in this manner enhances the sensitivity of the imaging sheet 1 to 2 f/stops and decreases gamma. From FIG. 2 it can be concluded that the photographic response of capsulated imaging materials can be controlled through the degree of deoxygenating exposure.

EXAMPLE 3

An imaging sheet similar to the imaging sheet of Example 2 but containing—g Irqacure 651 and 3 g Copikem X (in 50% dibutyl succinate) as the internal phase and using Mylar instead of the enamel stock as the support was placed between 2 glass plates with a step-wedge and mounted vertically. The sheet was continuously exposed from the back side (the side opposite the coated side) with a 15 watt fluorescent tube at a distance of 20 inches which was determined not to affect D max. The sheet was image-wise exposed 4 seconds with a U.V. lamp containing two 15 watt UV tubes positioned 5 inches from the front of the imaging sheet through a stepwedge. A second (control) sample was exposed from the coated side without exposing from the back side as above. The samples were developed by passing them through nip rollers in contact with a developer sheet prepared as in Example 2. Comparison of the step-wedge images resulting from the two samples revealed an increased sensitivity of the co-exposed sample over the control sample that was similar in magnitude (about 2.5 units of $\log_2 E$ in the higher density areas) to the increase in sensitivity achieved with the pre-exposure of example 1.

Having described the invention, it is to be understood that the invention is not limited to this precise process and product, and that changes may be made therein without departing from the scope of the invention which is defined in the appended claims.

What is claimed is:

1. A photosensitive material comprising a support having on a surface thereof a photosensitive layer including an image forming agent and a plurality of capsules, said capsules containing, as the internal phase, a radiation sensitive composition which undergoes a change in viscosity upon exposure to actinic radiation, said radiation sensitive composition including a photoinitiator and an agent different than said photoinitiator which sequesters oxygen in response to exposure which does not substantially change the viscosity of said radiation sensitive composition, said image forming agent being associated with said capsules such that by rupturing said capsules and releasing said internal phase said image forming agent is activated.

2. The photosensitive material of claim 1 wherein said capsules are microcapsules having a discrete capsule wall.

3. The photosensitive material of claim 2 wherein said radiation sensitive composition comprises a photopolymerizable ethylenically unsaturated monomer, a photocrosslinkable polymer or a combination thereof.

4. The photosensitive material of claim 3 wherein said image forming agent is present in said internal phase.

5. The photosensitive material of claim 1 wherein said image forming agent is a visible dye.

6. The photosensitive material of claim 1 wherein said image forming agent is a colorless electron donating color precursor.

7. The photosensitive material of claim 3 wherein said oxygen sequestering agent is an oxygen scavenging photoinitiator.

8. The photosensitive material of claim 3 wherein said oxygen sequestering agent includes a sensitizer which converts oxygen to singlet oxygen and a singlet oxygen scavenger with which reacts with said singlet oxygen.

9. The photosensitive material of claim 3 wherein said microcapsules are formed of a wall material having low oxygen permeability.

10. The phogosensitive material of claim 1 wherein said photosensitive layer comprises a binder or coating having a low oxygen permeability.

11. The photosensitive material of claim 3 wherein said oxygen sequestering agent has maximum sensitivity for radiation of a different wavelength than the actinic radiation to which said photoinitiator is most sensitive.

12. The photosensitive material of claim 11 wherein said oxygen scavenging agent is thermally sensitive.

13. A process for imaging a photosensitive material including a support having on a surface thereof a photosensitive layer containing an image forming agent and a plurality of capsules, said capsules containing, as an internal phase, a radiation sensitive composition which undergoes a change in viscosity upon exposure to actinic radiation, said radiation sensitive composition including a photoinitiator; wherein said image forming agent is associated with said capsules such that by rupturing said capsules and releasing said internal phase said image forming agent is activated, which comprises:
uniformly exposing said material to a first radiation of an intensity insufficient to substantially alter said viscosity but of sufficient intensity to sequester oxygen present in said capsules,
image-wise exposing said uniformly exposed material to a second radiation of sufficient intensity to substantially alter said viscosity, and
rupturing said capsules and image-wise releasing said internal phase from said capsules so as to thereby activate said image-forming agent to produce an image.

14. The process of claim 13 wherein said capsules are microcapsules having a discrete capsule wall.

15. The process of claim 14 wherein said radiation sensitive composition comprises a photopolymerizable ethylenically unsaturated monomer, a photocrosslinkable polymer or a combination thereof.

16. The process of claim 15 wherein said radiation sensitive comosition additionally comprises an oxygen sequestering agent, said agent having maximum sensitivity for radiation of a different wavelength than the actinic radiation to which said photoinitiator is most sensitive.

17. The process of claim 16 wherein said oxygen sequestering agent is an oxygen scavenging photoinitiator which generates radicals having a higher reactivity toward oxygen than towards said radiation sensitive composition.

18. The process of claim 16 wherein said oxygen sequestering agent comprises a sensitizer which converts oxygen to singlet oxygen and a singlet oxygen scavenger which reacts with said singlet oxygen.

19. The process of claim 16 wherein said oxygen sequestering agent is thermally activated.

20. The process of claim 17 wherein said first radiation is heat or infrared radiation and said second radiation is visible or ultraviolet light.

21. The process of claim 13 wherein said uniform exposure is conducted prior to said image-wise exposure.

22. The process of claim 13 wherein said uniform exposure is conducted at the same time as said image-wise exposure.

23. The photosensitive material of claim 11 wherein said radiation sensitive composition includes a polyethylenically unsaturated compound.

24. The process of claim 16 wherein said radiation sensitive composition includes a polyethylenically unsaturated compound.

25. The photosensitive material of claim 6 wherein said photosensitive material has associated therewith, on the same or a separate support, an election accepting developer material.

* * * * *